United States Patent
Nilsson et al.

(10) Patent No.: US 7,680,364 B2
(45) Date of Patent: Mar. 16, 2010

(54) WAVELENGTH LOCKING AND POWER CONTROL SYSTEMS FOR MULTI-CHANNEL PHOTONIC INTEGRATED CIRCUITS (PICS)

(75) Inventors: Alan C. Nilsson, Mountain View, CA (US); Robert W. Smith, Sonoma, CA (US); Yishai Kagan, Sunnyvale, CA (US); Paul N. Freeman, Saratoga, CA (US)

(73) Assignee: Infinera Corporation, Sunnyvale, CA (US)

( * ) Notice: Subject to any disclaimer, the term of this patent is extended or adjusted under 35 U.S.C. 154(b) by 240 days.

(21) Appl. No.: 11/427,624

(22) Filed: Jun. 29, 2006

(65) Prior Publication Data

US 2007/0092177 A1 Apr. 26, 2007

Related U.S. Application Data

(63) Continuation-in-part of application No. 10/267,330, filed on Oct. 8, 2002, now Pat. No. 7,079,715, and a continuation-in-part of application No. 10/267,331, filed on Oct. 8, 2002, now Pat. No. 7,283,694.

(60) Provisional application No. 60/695,382, filed on Jun. 30, 2005, provisional application No. 60/370,345, filed on Apr. 5, 2002, provisional application No. 60/328,207, filed on Oct. 9, 2001.

(51) Int. Cl.
*G02B 6/12* (2006.01)
(52) U.S. Cl. .............................. 385/14; 372/26; 372/32; 372/20; 372/50.1; 398/1; 398/9; 398/91
(58) Field of Classification Search .................. 372/26, 372/32, 20, 50; 398/1, 9, 91
See application file for complete search history.

(56) References Cited

U.S. PATENT DOCUMENTS 5,745,270 A 4/1998 Koch (Continued)

FOREIGN PATENT DOCUMENTS

| EP | 1133034 A2 | 9/2001 |
| WO | 0052789 A2 | 9/2000 |

OTHER PUBLICATIONS

C.H. Kim et al., 2.5 Gb/s X 16-CHannel Bidirectional WDM Transmission System Using Bidirectional Erbium-Doped Fiber Amplifier Based on Spectrally Interleaved Synchronized Etalon Filters, IEEE Photonics Technology Letters, vol. 11(6), pp. 745-747, Jun. 1999.

(Continued)

*Primary Examiner*—Charlie Peng
(74) *Attorney, Agent, or Firm*—W. Douglas Carothers, Jr.; Ross M. Carothers

(57) ABSTRACT

A transmissive active channel element is provided in each signal channel of a monolithic multi-channel TxPIC where each channel also includes a modulated source. The active channel element functions both as a power control element for both monitoring and regulating the output channel signal level of each signal channel and as a modulator for channel wavelength tagging or labeling to provide for wavelength locking the modulated sources. The power regulating function is also employed to control the channel signal power outputs of each channel to be uniform across the channel signal array. All of these functions are carried out by a feedback loop utilizing digital signal processing.

16 Claims, 5 Drawing Sheets

U.S. PATENT DOCUMENTS

| | | | |
|---|---|---|---|
| 5,825,792 | A | 10/1998 | Villeneuve et al. |
| 5,894,362 | A | 4/1999 | Onaka et al. |
| 6,005,995 | A | 12/1999 | Chen et al. |
| 6,055,078 | A | 4/2000 | Chen et al. |
| 6,233,262 | B1 | 5/2001 | Mesh et al. |
| 6,291,813 | B1 | 9/2001 | Ackerman et al. |
| 6,349,156 | B1 | 2/2002 | O'Brien et al. |
| 6,369,923 | B1 | 4/2002 | Kuo et al. |
| 6,385,217 | B1 | 5/2002 | Singh et al. |
| 6,445,477 | B1 | 9/2002 | Madsen et al. |
| 6,501,773 | B1 | 12/2002 | Volz et al. |
| 6,516,010 | B1 | 2/2003 | Broutin et al. |
| 6,611,341 | B2 | 8/2003 | May |
| 6,965,622 | B1 | 11/2005 | Cho et al. |
| 7,027,470 | B2 | 4/2006 | May |
| 2002/0090011 | A1 | 7/2002 | Pezeshki et al. |
| 2003/0095736 | A1 | 5/2003 | Kish, Jr. et al. |
| 2003/0095737 | A1 | 5/2003 | Welch et al. |
| 2004/0179840 | A1 | 9/2004 | Kai et al. |
| 2005/0084202 | A1 | 4/2005 | Smith et al. |
| 2005/0094926 | A1 | 5/2005 | Dominic et al. |

OTHER PUBLICATIONS

H. Lee et al., "Multichannel Wavelength Locking Using Transmission Peaks of an AWG for Multichannel Optical Transmission Systems", IEEE Photonics Technology Letters, vol. 10(2), pp. 276-278, Feb. 1998.

M Murakami et al., "A Remote Supervisory System Based on Subcarrier Overmodulation for Submarine Optical Amplifier Systems", Journal of Lightwave Technology, vol. 14(5), pp. 671-677, May 1996.

J.K. Park et al., "A Multi-Wavelength Locker for WMD System", Conference on Optical Fiber Communication (OFC 2000), pp. WE 4-1 to WE 4-3, Wednesday, Mar. 8, 2000.

M. Teshima et al., "Multiwavelength Simultaneous Monitoring Circuit Employing Wavelength Crossover Properties of Arrayed-Waveguide grating", Electronic Letters, vol. 31(18), pp. 1595-1597, Aug. 31, 1995.

C.J. Youn et al., "Optical Frequency Monitoring Technique Using Arrayed-Waveguide Grating and Pilot Tones", Electronic Letters, vol. 37(16), pp. 1032-1033, Aug. 2, 2001.

Y.C. Chung et al., "Synchronized Etalon Filters for Standardizing WDM Transmitter laser Wavelengths", IEEE Photonics Technology Letters, vol. 5(2), pp. 186-189, Feb. 1993.

Y.C. Chung et al., "Aging-Induced Wavelength Shifts in 1.5-Micron DFB Lasers", IEEE Photonics Technology Letters, vol. 6(7), pp. 792-795, Jul. 1994.

Y.C. Chung et al., "Temperature-Tuned ZnS Etalon Filters for WDM Systems", IEEE Photonics Technology Letters, vol. 4(6), pp. 792-795, Jun. 1992.

Y. Hamazuni et al., Transmission Capacity of Optical Path Overhead Transfer Scheme Using Pilot Tone for Optical Path Network, Journal of Lightwave Technology, vol. 15(12), pp. 2197-2205, Dec. 1997.

Y. Horiuchi et al., Wavelength Stabilization Technique Using Dithering-Induced AM Cancellation for DWDM Systems, IEICE Trans. Electron., vol. E84-C, No. 5, pp. 519-526, May 2001.

J.H. Jang et al., "A Cold-Start WDM System Using a Synchronized Etalon Filter", IEEE Photonics Technology Letters, vol. 9(3), pp. 383-385, Mar. 2000.

D.K. Jung et al., "Wavelength-Tracking Technique for Spectrum-Sliced WDM Passive Optical Network", IEEE Photonics Technology Letters, vol. 12(3), pp. 338-340, Mar. 2000.

FIG._2

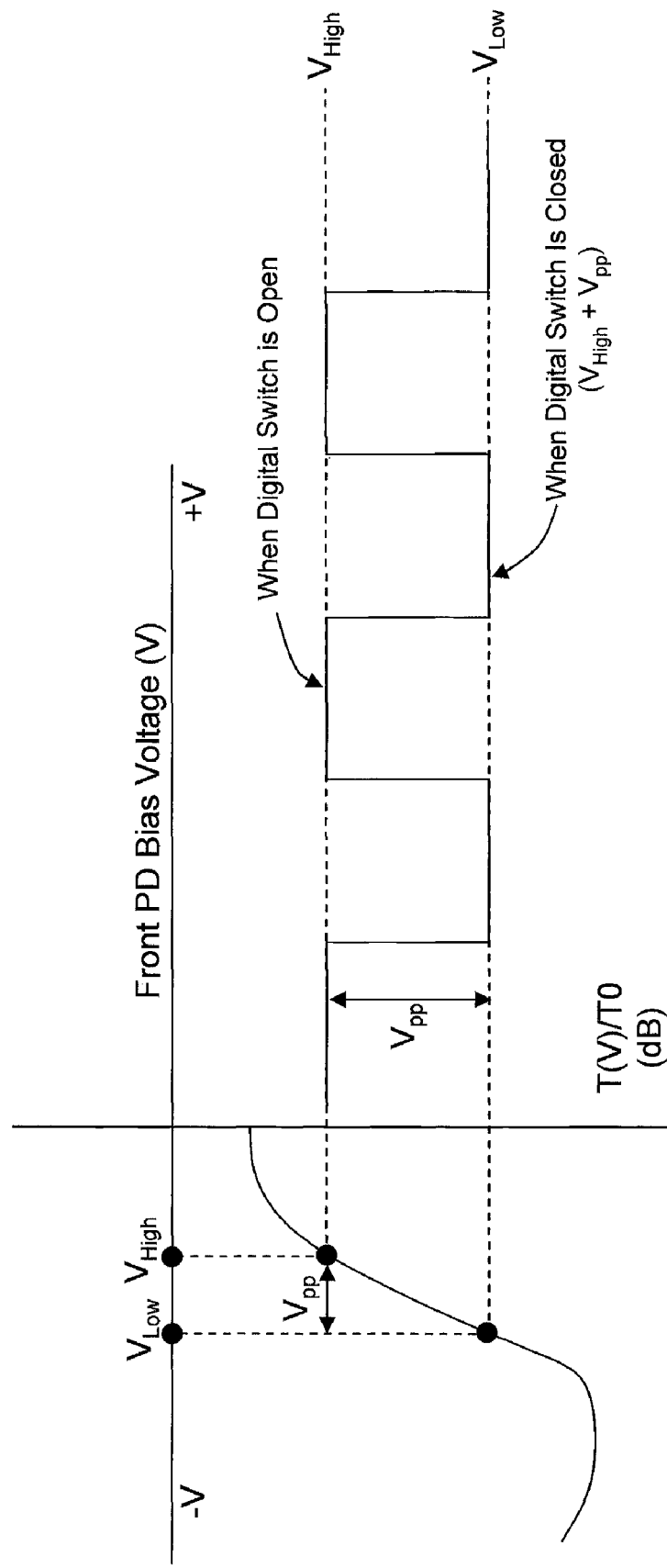
FIG._4

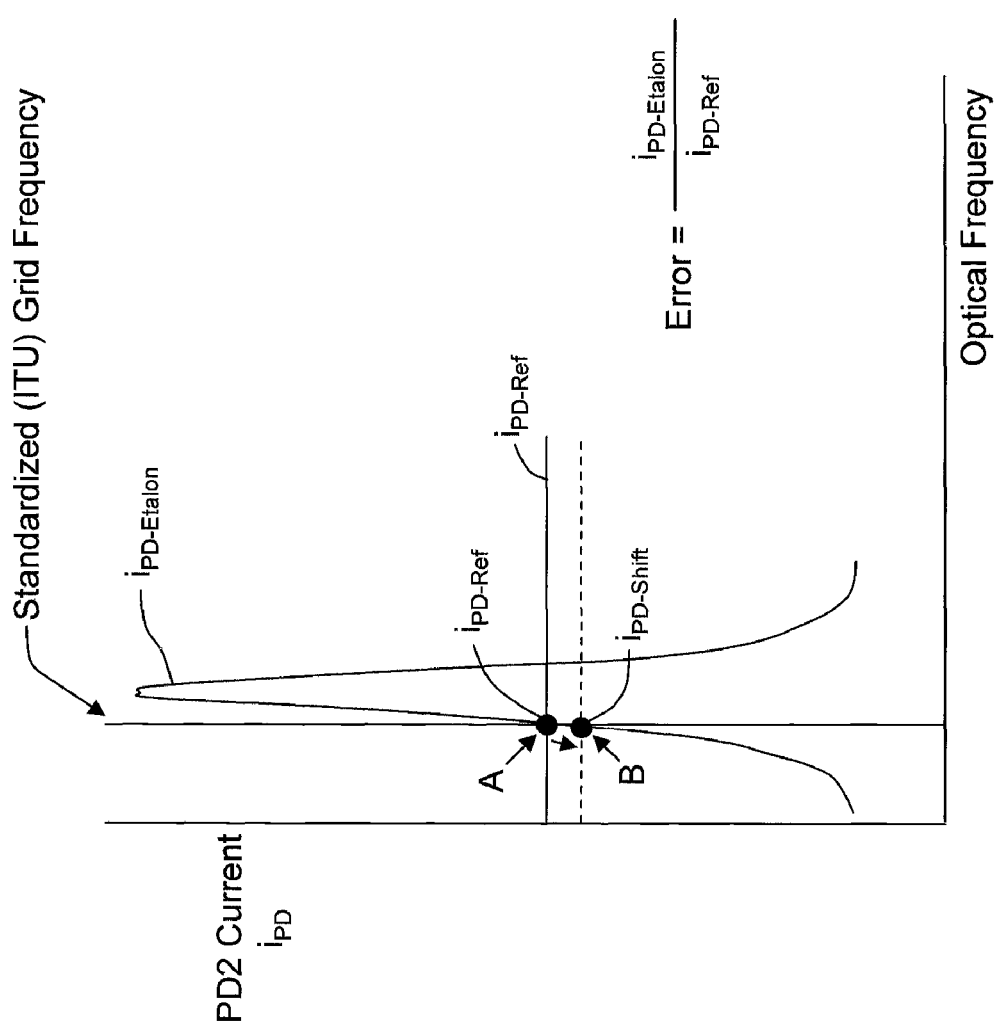
FIG._5

WAVELENGTH LOCKING AND POWER CONTROL SYSTEMS FOR MULTI-CHANNEL PHOTONIC INTEGRATED CIRCUITS (PICS)

REFERENCE TO RELATED APPLICATION

This application claims priority to provisional application, Ser. No. 60/695,382, filed Jun. 30, 2005, and is also a continuation-in-part of nonprovisional patent applications, Ser. No. 10/267,330, filed Oct. 8, 2002 and entitled, TRANSMITTER PHOTONIC INTEGRATED CIRCUIT (TxPIC) CHIP ARCHITECTURES AND DRIVE SYSTEMS AND WAVELENGTH STABILIZATION FOR TxPICs, which claims priority to provisional application Ser. No. 60/370,345, filed Apr. 5, 2002; and Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs, which claims priority to provisional application, Ser. No. 60/328,207, filed Oct. 9, 2001, all of which applications are incorporated herein by their reference in their entirety.

BACKGROUND OF THE INVENTION

This invention relates to wavelength locking and output power control systems relative to multiple WDM signal channels and more particularly to such signal channels as found in a monolithic transmitter photonic integrated circuit (TxPIC) chip having a plurality of integrated signal channels with each channel having a modulated source.

There are many feedback loop systems known for controlling the wavelength of an array of lasers, particularly discrete lasers or so called EMLs employed in an optical transmitter for use in an optical transport network. Also, there are feedback loop systems to control the output level of modulated signals produced in such transmitters so that their power levels are equal across the array of signal channel generators. This power equalization is also referred to in the art as pre-emphasis. A characteristic of a monolithic TxPIC with an integrated multiplexer is that the light that emerges from the TxPIC already combines a plurality of data-modulated optical wavelengths. While advantageous for reliability and reduction of cost, this integrated multiplexing function poses challenges for control of individual optical wavelengths and channel average powers, as the information required to control individual channel powers and wavelengths must be extracted from the optical multiplexed signal at the output of the TxPIC.

What is needed is a control system that can concurrently control emission wavelengths and powers on such an array of lasers and more particularly on an array of integrated lasers or modulated sources in a transmitter photonic integrated circuit (TxPIC) with an integrated optical multiplexer. The control system can advantageously employ integrated channel active elements to aid in such emission wavelength and signal output power control.

SUMMARY OF THE INVENTION

The channel wavelength and power control system of this disclosure provides principally three functions:

1. The locking of wavelengths of modulated sources of a multi-channel integrated TxPIC to a standardized wavelength grid employing a shared wavelength reference.

2. The prevention of wavelength locking to incorrect reference values under various aging, re-starting and channel failure scenarios.

3. The detection and controlling of the individual signal channel powers of a plurality of modulated sources in a monolithic transmitter photonic integrated circuit (TxPIC).

An important feature of this disclosure is employment of a PIC signal channel-specific tagging or labeling scheme and method that serves the dual functions of channel wavelength locking and channel power control.

Also, an important feature of this disclosure is the deployment of a controllable, transmissive active channel element provided in each signal channel of a multi-channel transmitter photonic integrated circuit (TxPIC). By "transmissive", we mean that the element is transparent to a channel signal from a modulated source propagating through the element. The controllable, transmissive, active channel element functions both as 1) a modulator for labeling each signal channel with an optical intensity modulation of known modulation depth and frequency to provide channel characteristic optical modulation tag, and 2) a power control element for regulating the output channel signal level of each TxPIC channel. Detection of attributes of an individual optical channel within an optical multiplexed signal is accomplished by detecting the strength of that channel's characteristic optical modulation tag. The feedback loops for both channel wavelength and channel power control provide for parallel control for all on-chip signal channels, i.e., each of the PIC channels on the TxPIC is provided with a modulated tone tag simultaneously and these tags are detected simultaneously in the output of a given photodetector receiving a composite signal from the optical multiplexed signal. Parallel signal processing of all channels in a multiplexed signal is important for an integrated PIC device because a change in channel wavelength and power can immediately affect the emission wavelengths and powers of neighboring signal channels. This effect is especially pronounced if an adjacent channel modulated source expires or dies. Thermal coupling of adjacent channels will have rapid, dynamic effect on the emission wavelengths of adjacent channels. Thus, a feedback control system must be able to respond rapidly, such as within one millisecond. Parallel signal processing, based on simultaneous demodulation of the tone tags placed on all signal channels, enables fast control of the channel wavelengths and powers in this coupled, multichannel system In the multi-channel integrated TxPIC, each signal channel includes a data-modulated source, defined as a directly modulated laser or a cw-operated laser with an external modulator. The transmissive active element of each channel may be, as one example, a waveguide PIN region, the transmission of which can be varied according to the reverse bias voltage (varying the absorption of the PIN) or the forward bias current (varying the gain of the PIN). A PIN region is an intrinsic region bounded by a p-type and n-type confinement region. For description purposes, this waveguide PIN region is hereinafter referred to as a "front PIN". However, as will readily be understood by those skilled in the art, the transmissive active element may be another channel transmissive active element, examples of which are provided later one in this disclosure. Each channel further includes a back photodetector (PD), whose purpose is to absorb substantially all of the light emitted from the backend of the channel laser source. At the time of manufacture, the back PD is employed to measure the photocurrent associated with a beginning of life (BOL) output power of each channel laser and a simulated end of life (EOL) output power of each channel laser. The ratio of laser forward output power to backward output power is substantially constant over life. Thus, the back PD photocurrent readings are a fairly good indicator of the forward light internal power output from each of the respective channel lasers on a TxPIC. Simulated EOL power is selected based upon estimation of laser degradation over life which is normally a few dB down from its BOL power output, such as, for example, between about 1.5 dB to about 3 dB of power output degradation over life. For each of the two selected optical output power levels from the channel laser source, the forward output power transmitted through the front PIN as a function of its bias state is detected to produce two curves referred to as transfer functions for that channel's front PIN. The beginning-of-life (BOL) transfer function curve represents the normalized transmittance versus reverse bias voltage of the front PIN at the BOL laser power state, for which the Back PD current is also known. The simulated end-of-life (EOL) transfer function curve represents the normalized transmittance versus reverse bias voltage of the front PIN at the simulated EOL laser power state, for which the Back PD current is also known. During operation, the following technique is used to estimate the normalized transfer function associated with the output power of the channel laser source. The current of the back PD is read, and its value relative to the known BOL and simulated EOL values is determined. Using the detected Back PD current as an interpolation parameter, linear interpolation between the normalized BOL and EOL normalized transfer functions is performed This interpolated transfer function is then employed to determine how to set the transmission of the front PIN to achieve a desired value for the channel output power. With the transfer function known, it is possible to set an average desired transmittance (using an appropriate average bias setting). It is also possible to introduce an intensity modulation of known modulation depth and desired average transmittance by selecting an appropriate AC modulating waveform for the bias of the front PIN. In this way, it is possible both to label an optical channel with an intensity modulation of known optical modulation index while also controlling the average power of the channel, using a single transmissive active element per channel.

To label the individual channels within an optical multiplexed signal, carefully selected intensity modulation waveform schemes can be used. One such labeling scheme uses square waves whose fundamental frequencies and phase relationships are chosen to produce approximate mathematical orthogonality of the product of any pair of different square waves over a particular integration time interval. In this scheme, each channel is intensity modulated by applying the appropriate square wave "tone" to the bias input of the channel's front PIN. The fundamental frequency of the square wave tone is unique to its assigned channel in the multiplexed signal, and the depth of optical modulation is made to be known and constant based on the calibrated transfer function (transmittance versus bias) of the channel's front PIN. All channels in the multiplexed signal of interest are intensity modulated in parallel, with waveforms synchronized to maintain optimal orthogonality. Detection of the attributes of an individual channel in the multiplexed signal involves demodulation of the composite detected signal using the channel's assigned label. Consider the output of a photodetector that has as its input a tapped portion of the optical multiplexed signal. The photocurrent will contain, among other things, AC signals associated with the constant optical modulation index intensity modulation labels for each channel in the multiplexed signal. The composite photocurrent signal can be converted to a voltage and densely sampled by an analog to digital converter to enable subsequent digital signal processing. To extract the information associated with a particular channel, the product of the sampled composite signal and the channel's selected and synchronized square wave is created and integrated over a period chosen to provide approximate orthogonality among different square waves labeling channels in the multiplexed signal. In this way, the portion of the composite signal that corresponds to the square wave labeling the individual channel of interest is extracted by digital signal processing, Owing to the approximate mathematical orthogonality of the selected square waves, the output of the integration process is a single number primarily determined by the strength of the tone labeling or tagging of a channel under test. Cross-correlation terms from all the other channels can be made sufficiently small to be negligible. The process of sampling the composite received signal and integrating with an appropriately synchronized version of the tone used to label the channel under test over the integration interval that preserves orthogonality is referred to as demodulation of that channel's label or tag. All channels in the multiplexed signal can be demodulated in parallel by submitting the sampled composite output signal from the photodetector to parallel integration processes, one for each label tone in the orthogonal labeling scheme. For an individual channel, the result of demodulation is a number indicative of the size of the AC label signal at the receiver. This AC label signal is proportional to the product of the average optical power of the channel the optical modulation index of the channel. If the optical modulation index of the channel is known, one can then readily deduce the average optical channel power. The advantage of this technique is that AC signal labels and AC signal processing are used deduce individual channel powers within a multiplexed signal, without requiring that the individual channels be separated out, such as through optical demultiplexing, for example, to allow detection of individual DC photocurrents. So, N signal correlations are concurrently applied for all N channels, simultaneously indicating the average power in each signal channel for N channels, provided the optical modulation index of each channel is known among possible labeling waveforms, square wave modulation is employed because the modulation frequencies can be carefully selected to exhibit near-zero cross-correlations over the integration interval and the modulation is easier to implement via digital switching, digital-to-analog converters (DACs) are employed to set both the voltage high level, $V_{High}$, and the voltage low level, $V_{Low}$, signals applied to the channel active element, and the digital output of an FPGA toggling between two voltages at the selected modulation frequency can drive an analog switch to generate the square wave modulation at the channel transmissive active element for each signal channel on the TxPIC. However, it should be noted, as will be evident by those skilled in the art that, for example, the waveform used for channel active element modulation could have been chosen to be sinusoidal. Orthogonality properties of sine waves are particularly well known.

Summarizing, the front PIN of each channel on the TxPIC serves two purposes. First, the front PIN serves as a controllable attenuator or gain element for the channel. Appropriate calibration of the normalized transfer function (transmittance versus bias) for the front PIN provides the information needed to determine the desired average bias state, given a target output value for the channel and a measurement of the actual output power of the channel. Second, the front PIN serves as a modulator to label the individual channel with an intensity modulation label or tag chosen to satisfy signal processing requirements including establishing and maintaining a known optical modulation index for each channel. Using the orthogonality properties of the selected channel labels, correlation techniques can be used to extract, from a composite photocurrent associated with detection of the multiplexed signal, the average optical powers of each of the individual channels making up the multiplexed signal. Therefore, a control system for the powers of individual optical channels within a multiplexed signal can be based on detecting a tapped fraction of the multiplexed signal with a simple photodetector and carrying out the demodulation process described above, together with the calibrated relationship between average bias and transmittance of the front PIN. In one version of this control system, an optical tap and photodetector can be used to route a fraction of the optical multiplexed signal emerging from the monolithic TxPIC with integral multiplexer. Demodulation of the output of the photodetector as described above allows measurement of the channel powers arriving at the photodetector, and feedback to the individual front PINs on the channels of the TxPIC allows the individual channel powers to be set to desired values. For example, the channel powers can all be made to be approximately equal at the photodetector. Alternatively, different channels may be controlled to different output power setpoints if desired.

The description of the demodulation process so far has addressed only the issue of power control for individual channels of a TxPIC. In conjunction with an appropriate form of wavelength reference, the demodulation signal processing can also be used to control the channel wavelengths of individual channels of a TxPIC.

The use of channel labeling and demodulation as described above in connection with detection of average optical channel powers of individual channels within an optical multiplexed signal can be extended to the application of wavelength locking as follows. A device such as a Fabry-Perot etalon can be manufactured such that its free spectral range (frequency spacing between adjacent transmission peaks) is selected to correspond to a desired frequency spacing such as may be associated with the conventional ITU frequency grid. For example, the free spectral range of the Fabry-Perot etalon might be selected to be 50 GHz. Through well-known optical alignment procedures, the transmission peaks of the Fabry-Perot etalon can be arranged such that each specific frequency associated with a 50 GHz ITU frequency grid is associated with a point roughly halfway up and along the side of a transmission fringe. The important result of this alignment process is that, for an optical carrier whose frequency is close to an ITU grid frequency, the transmission of the etalon depends on the optical carrier frequency; i.e. the ratio of transmitted power to incident power for the particular channel depends on the channel's optical carrier frequency and the local slope of the associated fringe of the Fabry-Perot etalon. In simple terms, the Fabry-Perot etalon can, therefore, provide an optical frequency discrimination function for any optical carrier frequency for which the desired setpoint corresponds to a point on the sloped side of a transmission fringe.

For a single optical channel, a sensor for detecting deviation of the optical carrier frequency can be developed by dividing or splitting a tapped portion of the multiplexed signal output from the TxPIC and sending the split signal portions through two different optical paths terminated by photodetectors. One path (the etalon path) causes collimated light from the optical channel to pass through the aligned Fabry-Perot etalon, which provides a frequency-discriminating function such that the transmitted power depends on the optical carrier frequency. The other path (the reference path) contains no optical frequency discriminator elements and simply provides a measure of the average power of the optical channel. Comparing the output photocurrents from these two paths allows one to measure the optical carrier frequency of the channel relative to its position on the associated Fabry-Perot etalon transmission fringe. For example, the ratio of the photocurrent from the etalon photodetector to the photocurrent from the reference photodetector provides a unique measurement of the optical carrier frequency that is independent of the optical channel power. Commercial devices such as a broadband Fabry-Perot wavelength locker which is available from JDSU, Inc. are well known in the art.

The application of the Fabry-Perot wavelength locker (or equivalent) for providing a measurement of the optical carrier frequency of a single optical channel has thus far been described in terms of detected DC photocurrents. If an optical multiplexed signal containing N multiple signal channels is routed to such a Fabry-Perot wavelength locker, the DC photocurrents can no longer be used to provide useful information about the optical carrier frequencies of the channels. Useful information can, however, be derived from the composite photocurrents of the etalon and reference photodetectors if the individual channels of the optical multiplexed signal are labeled by intensity modulation waveforms, as described previously, and if the outputs of both the etalon and reference photodetectors are sample and demodulated in parallel. For a given labeling tone frequency, the result of demodulation of the etalon photodetector signal will be a number proportional to the average optical power of the channel labeled by that tone frequency, the optical modulation index of the channel, and the optical carrier frequency of the channel (owing to the optical frequency-discriminator characteristic of the sloped side of an etalon transmission fringe). Similarly, the result of demodulation of the reference photodetector signal will be a number proportional to the average optical power of the channel labeled by that tone frequency, and the optical modulation index of the channel. From this pair of numbers resulting from demodulation, a measurement of the optical carrier frequency of the channel labeled by the tone frequency can be extracted from the composite signal resulting from illumination of the photodetectors by an optical multiplexed signal comprising multiple optical channels. Parallel demodulation of the etalon photodetector output and the reference photodetector output at all the tone frequencies provides a means of simultaneously measuring optical carrier frequencies of all channels in the optical multiplexed signal, using a single Fabry-Perot wavelength locker.

Given a calibrated relationship between ITU grid frequencies and transmission properties of etalon and reference paths of the Fabry-Perot wavelength locker, the measurements of optical carrier frequencies can be translated to measurements of deviations of optical carrier frequencies with respect to ITU grid frequencies. Using channel labeling and parallel demodulation as described previously, then, a single Fabry-Perot wavelength locker can be used to measure individual channel carrier frequencies in an optical multiplexed signal, and to relate those individual channel carrier frequencies to ITU grid frequencies, provided that each optical carrier frequency remains sufficiently close to its associated ITU grid frequency (to avoid ambiguities arising from the periodic transmission properties of the etalon).

The multiplexed optical output of a multichannel TxPIC, labeled as described in connection with optical channel power control, can be routed to a single Fabry-Perot wavelength locker and processed as described above to measure the individual optical carrier frequencies of each channel of the TxPIC. Given a means of altering the optical carrier frequency of a TxPIC channel, one can complete a control system that locks each channel of the TxPIC to an assigned optical carrier frequency along a standardized wavelength grid, such as ITU grid frequencies. One such means of controlling the optical carrier frequency of an individual channel on a TxPIC is a local heater next to the laser that generates the optical carrier frequency of the channel.

As previously indicated, while the front PINs of the plurality of signal channels on a TxPIC are employed to provide dual functions of maintaining desired signal channel output power and laser emission wavelength, it should be importantly noted that other channel active elements in each PIC signal channel can also be contemplated to provide this dual functionality. Examples of such other channel integrated active elements are the channel laser source, the channel external modulator, a channel variable optical attenuator (VOA), a channel semiconductor optical amplifier (SOA) or a channel combination SOA/VOA.

While this invention is described as being applicable to the control the wavelength and power between or among a plurality of integrated signal channels in a monolithic transmitter photonic integrated circuit (TxPIC), it would be readily recognized by those skilled in the art that the fundamentals of this disclosure are equally applicable to other WDM signal channel systems, such as, but not limited to, those optical transmission systems having discrete and separate signal channels, such as, in the case where each signal channel comprises a separate and discrete cw laser and corresponding discrete external modulator or a discrete directly modulated laser, or a discrete but integrated electro-absorption modulator/laser referred to as an EML. Such WDM signal channel systems would also include discrete means to combine or multiplex the signals to provide an optical multiplexed signal output from multiple of such separate modulated sources.

BRIEF DESCRIPTION OF THE DRAWINGS

In the drawings wherein like reference symbols refer to like parts:

FIG. 4 is a graphic illustration of the normalized front PIN transfer function at constant wavelength, temperature, and input power.

FIG. 5 is a graphic illustration of error determination relative to optical frequency shift relative to etalon photocurrent for a given standardized (ITU) grid frequency.

DETAILED DESCRIPTION OF DISCLOSURE EMBODIMENTS

Figure 1:
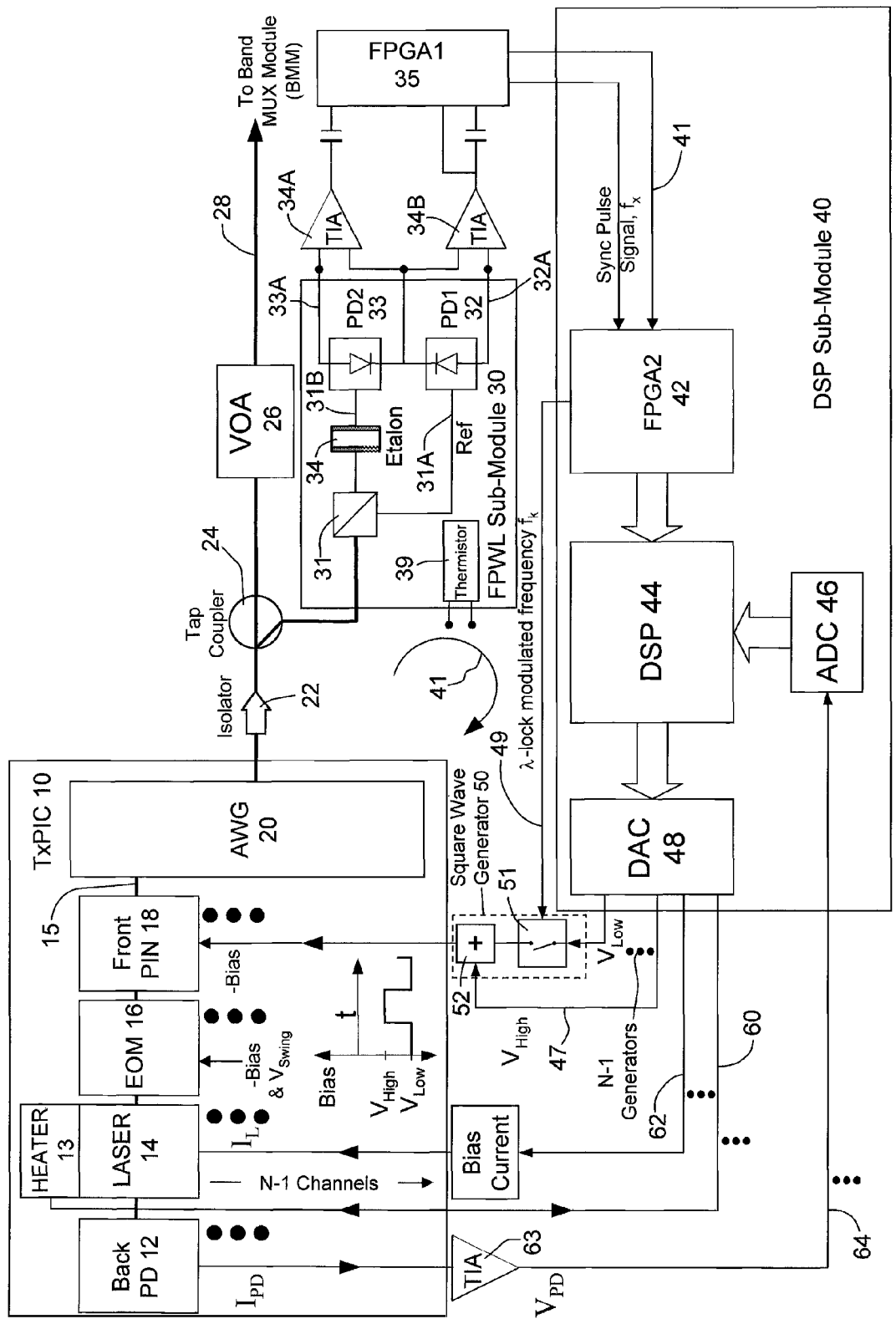
FIG. 1 is a schematic illustration of the wavelength and power control system for a multi-channel transmitter photonic integrated circuit (TxPIC) of this disclosure.

In FIG. 1, transmitter photonic integrated circuit (TxPIC) 10 may be a semiconductor circuit chip and contains a plurality of N integrated signal channels 15 where each channel comprises, in a serial train of elements along each channel, a back photodetector (PD) 12, a semiconductor laser 14 (DFB laser or DBR laser), electro-optic modulator (EOM) 16 (shown here as an electro-absorption modulator or EAM but can also be, for example, a Mach-Zehnder modulator) and a front PIN 18. We refer to a signal channel combination of laser 14 and electro-optical modulator 16 as a channel modulated source. Another type of modulated source that may be employed in channels 15 of TxPIC 10 is a directly modulated laser which, of course, removes the requirement for an external modulator 16 in each channel 11. In TxPIC 10, there are, then, N signal channels 15 with N lasers 14 that have different optical carrier frequencies or emission wavelengths that operate along uniform frequency grid spacing, such as at 50 GHz, 100 GHz, or 200 GHz. The laser CW light output is data signal modulated at a channel electro-optic modulator (EOM) 16.

Only one such channel 15 is shown for purposes of simplicity in FIG. 1 but the other N-1 signal channels would be approximately aligned with the first signal channel with all their outputs optically coupled to the integrated optical combiner, such as, for example, a multiplexer (arrayed waveguide grating or AWG) 20, which combines the modulated channel signal outputs generated at the modulated sources and provides an optical channel group (OCG) multiplexed signal on the output waveguide from TxPIC 10. Such a combiner may also be, for example, an Echelle grating (wavelength selective combiner) or an optical coupler, such as an MMI coupler (free space coupler). This PIC output is provided off-chip to an isolator 22, a tap coupler 24, a variable optical attenuator (VOA) 26 and on to an output waveguide 28 to another module, indicated here as a band multiplex module (BMM) which is disclosed and discussed in US nonprovisional patent application, Ser. No. (P096), filed June xx, 2006, a nonprovisional patent application of provisional application Ser. No. 60/695,508, filed Jun. 30, 2005, which applications are incorporated herein by its reference. As used herein, OCG is a particular channel group for a given TxPIC 10, as other TxPICs with different emission wavelength channel groups (OCGs) may also be provided in the same module carrying the embodiment shown in FIG. 1 (referred to as a digital line module or DLM) as TxPIC 10, each with its own feedback loop 41, and also with their outputs provided to the same BMM on waveguide 28 where all the OCGs are combined for transport on an optical transport network optical link. More about DLMs can also be seen in U.S. nonprovisional application, Ser. No. 11/154,455, filed Jun. 16, 2005, which is also published on Dec. 25, 2005 at US 2005/0286521 A1, which application is incorporated herein by its reference. As an example, there may be N-equal-ten signal channels 15 on TxPIC 10. However, many more signal channels may be placed on the same TxPIC, such as 40 signal channels or more. Each signal channel 15 integrated on chip 10 provides a modulated signal output having a different peak wavelength, such as in the spectral range of the C band on the ITU wavelength grid, which emission wavelengths are set by each signal channel's corresponding semiconductor laser 14. As previously indicated, each of these modulated outputs is provided to the input of optical multiplexer 20, shown here as an arrayed waveguide grating (AWG). TxPIC 10 of FIG. 1 is detailed in U.S. patent application Ser. No. 10/267,331, filed Oct. 8, 2002, and also published on May 22, 2003 as Publication No. US2003/0095736A1, supra.

In FIG. 1, a wavelength locking and power control feedback loop 41 is provided for multichannel transmitter photonic integrated circuit (TxPIC)10. One aspect of this disclosure, among several important aspects, is the employment of a front PIN 18 in each signal channel 15 of TxPIC 10 both as power control element to function as a variable channel attenuator and as a low frequency tone modulator for channel labeling or tagging used in both channel power control and channel wavelength locking. Channel tagging information is employed in the feedback loop 41 for both wavelength and power control, i.e., respectively, to control the on-chip channel laser emission wavelengths and to control channel signal outputs in each signal channel 15, e.g. to achieve equalized channel signal power outputs across the signal channel array on TxPIC 10. These processes are accomplished by digital signal processing as described previously. Thus, an integrated channel front PIN 18 for each channel functions both as an attenuator to set average optical power output of each channel as determined by adjusting the average reverse bias voltage per signal channel and as a transducer for intensity modulation of the optical signal received from channel modulated sources. The intensity modulation chosen here is square wave and is produced by toggling the reverse bias voltage applied to each front PIN 18 between two values of reverse bias voltage which are referred to herein as $V_{High}$ and $V_{Low}$ so that the voltage peak-to-peak of the modulated square wave is $V_{High}$ minus $V_{Low}$ as best illustrated in FIG. 4 and is also depicted in the inset in TxPIC 10 in FIG. 1. As previously indicated, the intensity modulation waveform impressed on the channel signal for tagging could alternatively be a sine wave instead of a square wave. The peak-to-peak value of the modulating square wave, $V_{PP}$, together with the transfer function of the front PIN, determines the optical modulation index, which is made constant. While adjusting channel output power, the maximum and minimum values of $V_{PP}$, i.e., $V_{High}$ and $V_{Low}$ would change to adjust average attenuation of the front PIN while maintaining optical modulation index constant. Depending on the output power setpoints for individual channels, different signal channels may be controlled to produce equal output powers or, if desired, unequal output powers, as used, for example, in channel pre-emphasis. This square wave modulation on each front PIN 18 is produced by generators 50 which will be discussed in more detail later. Thus, a square wave intensity modulation with a different square wave frequency is provided to each front PIN 18, and all channels on the TxPIC are simultaneously and synchronously modulated at all times. Each channel on the TxPIC is labeled by a unique square wave, and the set of all square waves is chosen to be approximately orthogonal over a selected integration interval.

In the embodiment of FIG. 1, lasers 14 are driven by a constant current over life so that the combination of bias current, heater current, and sub-mount temperature is set at the time of manufacture to make the output wavelengths substantially close to a standardized grid desired for their respective wavelength emission operations, and to provide adequate output power for each channel. A laser heater 13 is provided locally to each laser 14. Heater 13 can alter the optical carrier frequency of each laser 14 in response to a change in joule heating provided via heater current which changes the temperature of laser 14 to change its emission wavelength by a small incremental amount. For example, a TxPIC laser may tune with temperature at a rate of approximately −10.6 GHz/° C. Additional information in regard to such heaters is set forth in nonprovisional applications, Ser. Nos. 10/267,330 and 10/267,331, supra.

For bi-directional control of laser frequency employing such a heater 13, laser 14 must operate at a locally elevated temperature so that reduction of input power to the heater causes the laser temperature to drop, decreasing the laser emission wavelength. When the laser is operated at an emission wavelength close to its standardized grid wavelength, then the accompanying laser heater 13 must supply nonzero power. The cooling rate depends on the heater-supplied elevation in laser temperature. The laser itself is then operated at a locally elevated temperature so that in the case where it is desired to lower the laser emission wavelength, the current to the heater is reduced. Tradeoffs must be made between the cooling rate, long term aging budget for the laser wavelength shift, and thermal constraints for TxPIC 10. It should be realized that the minimal temperature elevation to be provided by a laser local heater at the end of its bidirectional control range is a small amount, from about 1° C. to about 2° C.

As previously indicated, optical intensity modulation, preferably a square wave, is superimposed via the front PINs 18 in each of the N signal channels of TxPIC 10. The square wave modulation or tone frequency is different for each channel and the modulating square wave voltage is superimposed on front PIN 18 for each signal channel. The amplitude of the tone drive voltage is contingent upon the required attenuation to be induced by the front PIN 18 and the local shape of the front PIN transfer function for that desired attenuation setting. The peak-to-peak voltage of the modulating square wave is scaled to provide a predetermined, constant optical modulation index (OMI) for the tone-modulated output light The aggregate optical channel group (OCG) from TxPIC multiplexer 20 is tapped at 34 and provided to the Fabry-Perot wavelength locker (FPWL) sub-module 30. The tapped output is split by splitter 31 between reference line 31A and etalon line 31B. In etalon line 31B, the split light is provided to etalon 34. The reference optical signal on line 31A and etalon optical signal on line 31B are detected by respective photodetectors PD1 32 and PD2 33 and their respective photo-detected current signals of PD1 and PD2 are converted into voltage signals by transimpedance amplifiers (TIA) 34A and 34B and are digitized by a fast analog to digital converter (ADC). The digitized output waveform is correlated (multiplied by a delayed duplicate of the modulating square wave and integrated over a predetermined time interval) via a first field programmable gate array chip (FPGA1) 35. Note that PDs 32 and 33 function as low pass filters and only detect low frequency signals including the channel labeling tones. These PDs therefore do not respond to the high frequency data modulation such as 10 Gbit/sec. or 40 Gbit/sec data modulation. In the signal processing associated with FGPA1 35, the analog current signals are sampled over a predetermined time interval, such as 1 millisecond. Both output signals 31A and 31B are both employed for the purpose of wavelength locking where detected wavelength offsets are determined from these signals and laser emission wavelength is accordingly adjusted via laser heaters 13. For the purpose of power control, however, only the reference output 31 is needed for this purpose.

Figure 2:
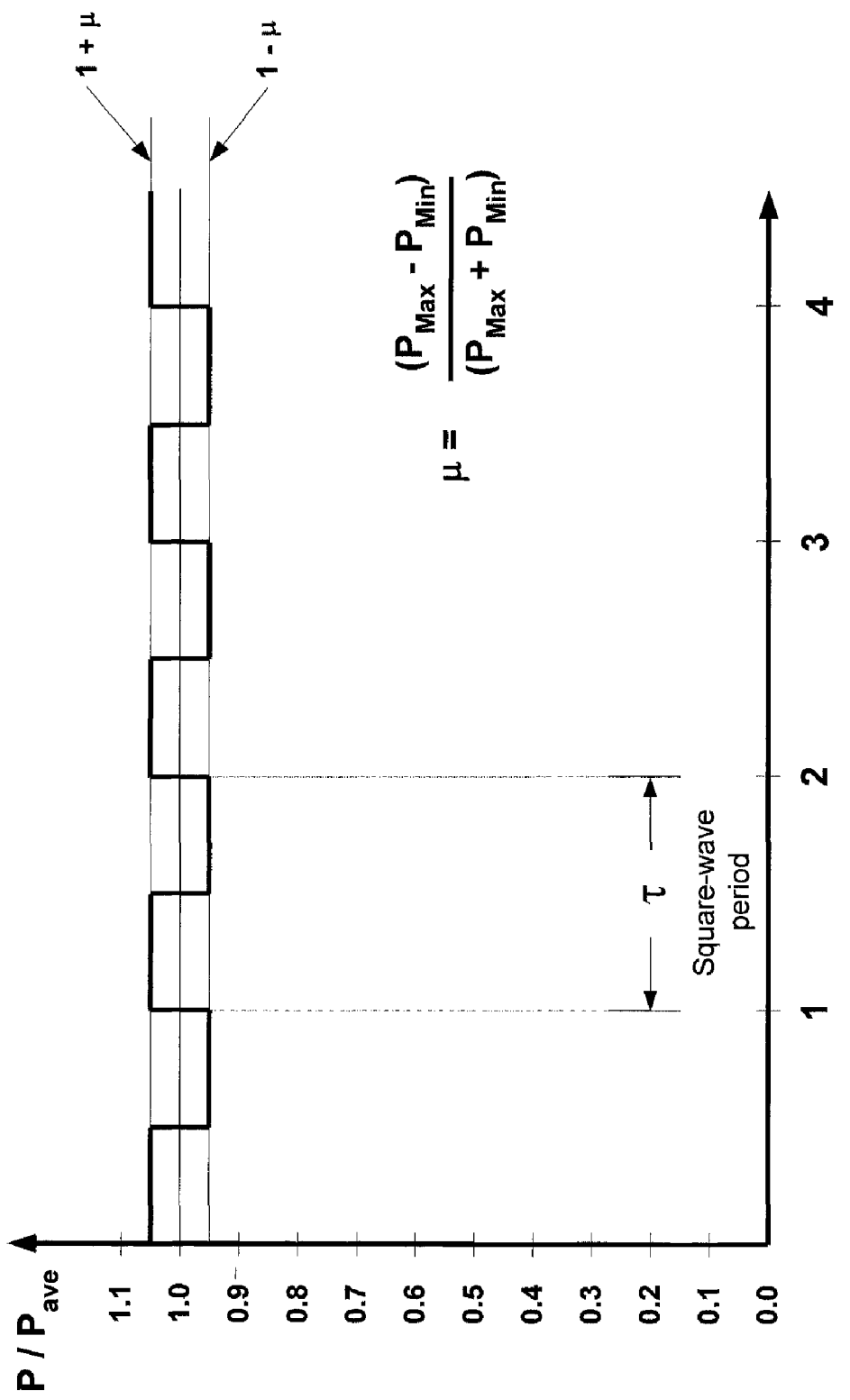
FIG. 2 is a graphic illustration that defines the optical modulation index (OMI) for a square wave where the optical modulation index μ here is shown as 0.05 (5%).

Front PIN 18 is, thus, the active transmissive channel element employed for both a channel power control element and a modulation element for channel labeling or identification. In the case of channel power control, the front PIN provides for voltage-controlled attenuation over the channel modulated signal to maintain it at a desired power level. In initial operation upon PIC manufacture, the individual channel attenuations are set for beginning of life (BOL) values selected to allow bidirectional control of channel power over life For example, the source laser may exhibit power decay over life. Such decay over life may be in the range, for example, from about 1 dB to about 3 dB, usually around 2 dB. Also, as previously indicated, the front PIN average reverse bias voltage is set by generator 50, preferably a square wave source at a channel-specific frequency of a channel labeling tone. To maintain compatibility with per-channel power measurements, the optical modulation index (OMI) associated with a channel labeling tone is held constant at each channel as the average attenuation at element 18 is varied over time. The OMI for the square wave is shown in FIG. 2. The peak to peak voltage swing of the modulating voltage, therefore, needs to change depending on the local slope of the transfer function, such that the OMI remains constant. The shape of the transfer function depends on how much optical power is being dissipated in the front PIN 18 and will change over life of TxPIC 10 due to changes in output power from laser 14 as well as other optical changes of other in-channel optical elements upstream from front PIN 18.

While a sine wave modulation for tone applications may be generally employed in the art because orthogonality over an integration integral is more simply achieved, we employ square wave modulation because that modulation is easier to implement by simple switching between to voltage levels at a desired frequency. In general, channel 1 on TxPIC 10 may have the lowest tone frequency for the optical channel group (OCG) and each succeeding channel has a higher tone frequency separated by one or more kHz. For example, the range of frequencies may be in the range of about 42.057 kHz to about 87.771 kHz spread over, for example, ten signal channels 15. However, the range of tone separation and channel direction of tone increase can be in any order or direction. The kHz tones may be of random value along the plurality of signal channels as long as they are each at a different frequency and are chosen to maintain proper orthogonality over the integration interval. The OMI is defined as $\mu$, which is the difference between the maximum output power and the minimum output power over the sum of the maximum output power and the minimum output power. In the case here, the OMI is shown as 5%, i.e., $\mu=0.05$, which corresponds to about 0.44 dB difference in the transmitted powers between the modulation high point and the modulation low point. The value for $\mu$ is simply the amplitude of modulation when the OMI is normalized to the average transmitted power, i.e., the average power after modulation from front PIN 18.

While in this description, the channel front PIN 18 provides for the above described dual control functionality, it is also within the scope of this disclosure as other embodiments to place the tone intensity modulation alternatively on the semiconductor laser 14 in each channel 15 or on the electro-optical modulator (EOM) 16 in each channel 15. Further, in another embodiment, it is possible to superimpose the channel-labeling modulation on the channel modulator 16 of each channel 15 primarily for wavelength tagging and control and employ the channel front PIN 18 primarily for power control. Still in a further embodiment, a front PIN or similar optical element acting as a variable optical attenuator (VOA) may be replaced with a semiconductor optical amplifier (SOA) in each channel 15 or a combination VOA/SOA may be placed within each channel 15. Lastly, in a still another embodiment, the channel signal tagging and wavelocking modulation may be superimposed on each channel modulator 16 with a channel SOA employed for providing power control to achieve power equalization across the channel signal array.

1. Locking Wavelengths of a Multi-Channel Integrated TxPIC to a Standardized Wavelength Grid Values Using a Shared Wavelength Reference Value

A. Wavelength Locking

A frequency tone, usually of low frequency, is placed on each laser carrier frequency that functions as a different identification (ID) tag for each laser as well as a means by which modulated source wavelength can be determined in an acceptable time period. Thus, the different frequency tones superimposed on front PINs 18 permit detection of each optical carrier frequency of each modulated source using a single wavelength reference. These tone frequencies have frequencies well below the established bandwidth of wavelengths used to modulate data on each of the channels, which is greater than 1 Gbits/sec. A discussion about the use of tone frequencies in this manner is disclosed in some detail in U.S. patent application, Ser. No. 10/267,330, supra.

In FIG. 1, the Fabry-Perot wavelength locker (FPWL) sub-module 30 provides the optical frequency reference values to which PIC lasers 14 may be locked. For sufficiently high accuracy to be achieved, such as, with accuracy to the ITU grid around ±1.25 GHz, the servo loop 41, as represented by sub-modules 30 and 40, including two field programmable gate array (FPGA1 and FPGA2) chips 35 and 42, are supplied with a calibrated value of the ratio of the photocurrents supplied, respectively, from the etalon path 33A from etalon PD2 33 and its accompanying TIA circuit 34A and from the reference path 32A from reference PD1 32 and its accompanying TIA circuit 34B at the desired standardized wavelength channel value. Also, the steady state error servo loop must be zero. In the embodiment here, sub-module 30 is employed, therefore, to provide a simultaneous reference for N TxPIC channels having a predetermined desired carrier frequency separation, such as in the embodiment here which is 200 GHz. Since there is a deployment here of a single FPWL 30 as a simultaneous reference for N TxPIC lasers 14 or signal channels 15, which are separated by a given uniform frequency interval, e.g. 200 GHz, the use of just DC photocurrents provided by the etalon and reference photodiodes will not, itself, suffice. This is why each channel signal on channels 15 is square wave intensity modulated via its channel front PIN 18 at a signature fundamental tone frequency with all optical carried frequencies from the lasers so modulated continuously in parallel each with its own signature frequency, i.e., the frequencies of the tones are different from one another.

Two field programmable gate array (FPGA1 and FPGA2) chips 35 and 42 are utilized in the feedback loop 41. FPGA2 42 has its own tone generator for the N tone frequencies, $f_k$, for application to each of the N square wave generators at 50 for application to each of the N front PINs 18. FPGA 1 35 has its own square wave frequency generator to generate the N tone frequencies, $f_k$, for purpose of demodulation of the output signals from the FPWL photodetection circuits. Both photocurrents from PD1 32 and PD2 33 are used for this purpose. A synchronization pulse from the tone generator at FPGA1 35 is provided to the tone generator at FPGA2 42 to maintain timing between the modulating tone and the demodulating tones.

Square wave generators 50, as shown in FIG. 1, each comprise an analog switch 51 that is driven at tone frequency, $f_k$, by a voltage as received from FPGA2 42 via lines 49. Summer 52 is set with a negative bias via DACs 48 so that the switch 51 is modulated to be turned off and on according to the predetermined frequency for each respective channel. Thus, the DACs associated with a square wave generator set the high level and low level signals ($V_{High}$ and $V_{Low}$), and the analog switched is toggled at the frequency sent to it by FPGA2 42 $V_{High}$ is provided from DACs 48 via lines 48 to summers 52 from which the depth of modulation is determined by $V_{Low}$ as illustrated graphically in the square modulation inset shown on TxPIC 10.

Error signals, representative of a particular laser wavelength offset from its desired emission wavelength on the grid, are derived from the digital signal processor (DSP) 44 to provide corrective changes of current to respective laser heaters 13 on TxPIC 10 via digital-to-analog converters (DACs) 48 and lines 60 to the respective heaters 13. Digital signal processor (DSP) 44 is provided measurements of the tone strengths (for each channel) as detected by parallel demodulation of the outputs of the reference and etalon photodetector circuits. DSP 44 derives an appropriate error signal by, for example, taking the ratio of the tone strengths for a particular channel, and comparing that ratio to a calibrated value corresponding to the desired wavelength. Also, DACs 48 provide the set bias current, $I_L$, to respective lasers 14 via lines 62 from DACs 48. Also, DSP 44 receives back PD 12 photocurrents, $V_{PD}$, from each channel for N lasers 14 on lines 64 via their respective TIAs 63 and analog-to-digital converters (ADCs) 46. Thus, the monitoring and control of heater currents and laser bias currents is accomplished by DSP 44 to prevent any attempt to drive lasers 14 to improper lockpoints.

In FIG. 1, the frequencies and phases of the N square waves provided by generators 50 are chosen to be approximately mathematically orthogonal over a fixed sampling period, such as, for example, approximately 1 ms. These square wave signals are synchronized at the start of each sampling period. From the basic set of square waves with an integer number of cycles in a fixed sampling period, a nearly orthogonal set of N square waves can be selected, i.e., the product of two different square waves when integrated over a given interval, will provide a number very close to zero, while the product of two identical square waves, when integrated over the same interval, will produce a large number that can be normalized to unity. It is these normalized values that are indicative of channel wavelength drift via outputs derived from both the etalon output at 31B and the reference output at 31A and tone strength derived from the reference output at 31A. The modulation tone frequencies are chosen to be in a comparatively higher kHz range of frequencies to enable faster measurement of any wavelength shifts, e.g., the tone frequencies are chosen to be greater than 40 kHz.

As indicated previously, the peak-to-peak voltage swing of each modulating square wave modulation supplied to the channel's front PIN, which is the difference between its high point or $V_{High}$ and its low point or $V_{Low}$, is determined such as to provide a predetermined and constantly maintained optical modulation index (OMI) in the output power of each N signal channel. The percentage of OMI must be large enough to provide an adequate signal to noise ratio for the signal processing and small enough to avoid excessive penalties for the data (e.g. due to eye closure. If the OMI is too small, circuit measurements will become too inaccurate owing to circuit voltage offsets, dark current and leakage current. If the OMI cannot is too large, the transmitted data will suffer from eye closure penalties. As an example, a 5% OMI is an acceptable choice that induces a tolerable eye closure penalty while still producing large enough control signal to achieve a robust result against signal errors and noise. The channel-specific voltage values for the square wave required to produce such an OMI depends on the set DC bias point of each front PIN 18. Because their DC bias point deliberately varies as part of the per-channel power control, the voltage values of the square wave modulation must be controlled by the deployment of a lookup table or by the servo control loop 41 of FIG. 1 to continually maintain a fixed OMI over time for all modulated tone frequencies, $f_k$.

Figure 3:
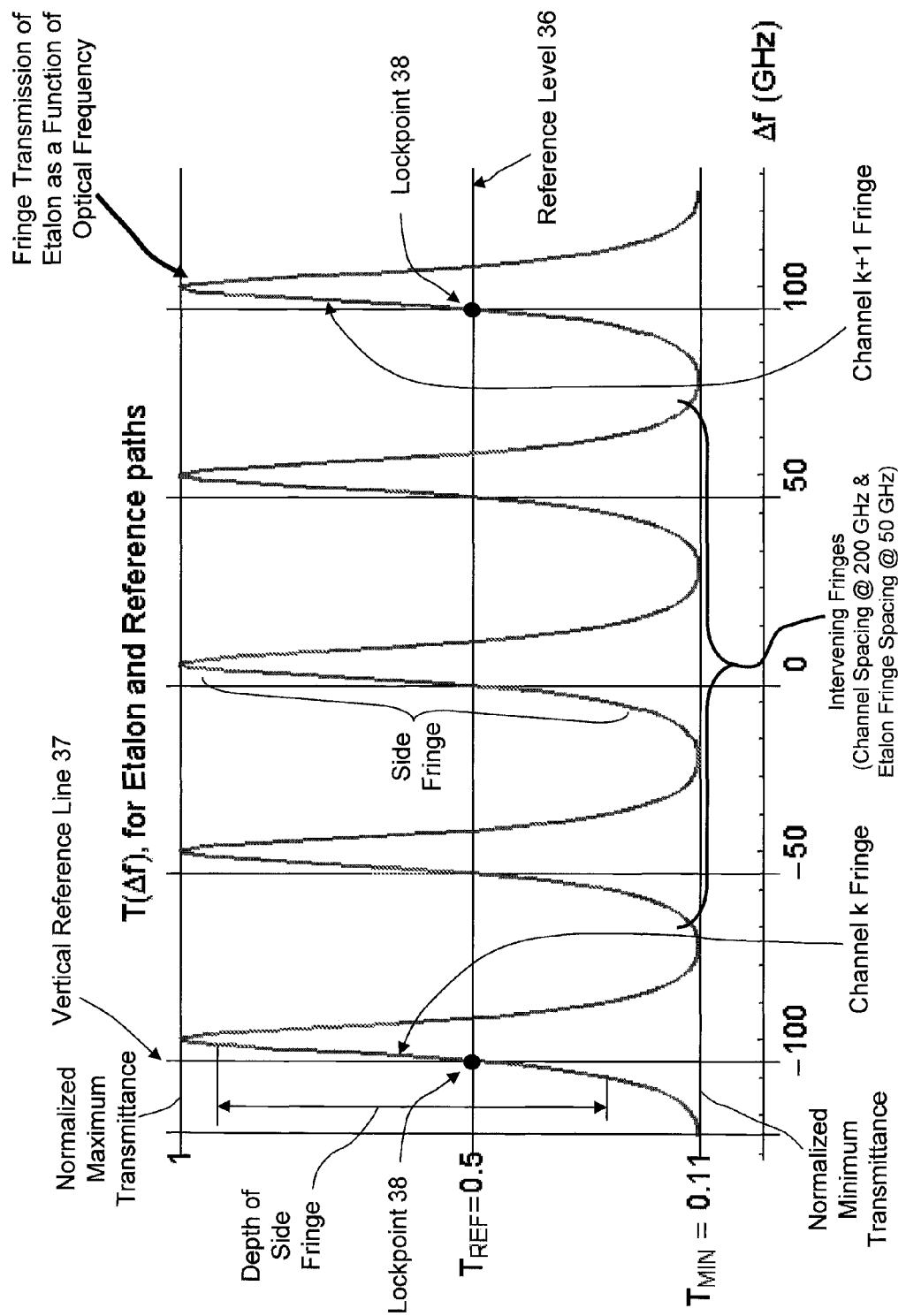
FIG. 3 is a graphic illustration of a 50 GHz free spectral range etalon transmission curve as a function of optical frequency showing the relationship between etalon transmission peaks and optical carrier frequencies for a channel k and a channel k+1 having a 200 GHz grid spacing between signal channels in a multi-channel transmitter photonic integrated circuit (TxPIC).

It should be noted that etalon 34 can be procured with a specific periodic response that matches the signal channel spacing or interval. However, we have chosen etalon 34 to have a periodic response of 50 GHz and its fringe transmission relative to signal channels k and k+1 is illustrated in FIG. 3. The reference signal in output 32A has a response that is approximately independent of optical wavelength. As previously indicated, the signal channel interval in the embodiment here is 200 GHz so that the etalon response will be a divisor of that spacing, i.e., there will be three unutilized etalon fringes between the etalon fringes associated with signal channels k and k+1. The same 50 GHz etalon is, therefore, useful to perform the same frequency discriminator function for other TxPIC channel spacings at integer multiples of the free spectral range, such as 50 GHz or 100 GHz, as well as for TxPICs having a larger number N of signal channels, such as, for example, 40 channels per TxPIC. Etalon 34 is a commercially available Fabry-Perot etalon that has a 50 GHz periodic function versus optical frequency and is readily available from different manufacturers, such as from JDSU, Inc. The manufacturing process for the Fabry-Perot wavelength locker includes setting the relationship between the ITU grid and the transmission peaks of the etalon such that the ITU frequencies correspond to points roughly halfway up the sloped side of a transmission peak. The slope side of the transmission peak, thus, acts as a local frequency discriminator where small changes in optical carrier frequency produce detectable changes in transmitted power.

B. Locking to Correct Lockpoints

It should be noted that the higher frequency data modulation imposed on the channel signals by the modulated sources 14, 16 is not within the bandwidth of the two photodiodes 32 and 33 in FPWL sub-module 30 and, therefore, does not directly appear in their photocurrent signals. Reference level 36 in FIG. 3 provides a point along the rising side (where optical power transmission increases as optical frequency increases) of an etalon fringe, where a useful lockpoint may be established. This point can be almost anywhere along the side of a fringe, provided that the local slope is sufficiently large. Vertical reference level lines 37 that cross the fringes are used to indicate a point of intersection between the ITU optical carrier frequency and the side of an etalon fringe, for a given sensed temperature of etalon 34. Sensor 39 is employed to passively determine where the point of intersection is between a fringe in FIG. 3 with vertical reference 37 and this accomplished by an initial calibration as to a set of temperatures measured at etalon 34 over a range of possible temperatures as related to a set of photocurrents for each PD 32 and 33 so that with the use of this calibration, the relative values of the output photocurrents from PD 32 and PD33 are known at ITU grid frequencies. Thus, an established lockpoint 38 along the fringe side provides a means by which detected values along the fringe side either up or down relative to lockpoint 48 can be detected electronically. The amount of offset from calibrated lockpoint 38 is then employed to determine which direction and, when converted into digital form, by how much the laser emission frequency or wavelength has shifted from its desired standardized grid frequency. Thus, in the case of a single CW laser 14 in a single optical channel 15, as opposed to multiple channels on a PIC, would produce the calibrated lockpoint ratio of DC photocurrents from etalon and reference photodiodes 32 and 33 if the cw optical channel were at the lockpoint optical frequency on the standardized grid, such as the ITU grid.

When the tapped portion of the optical multiplexed signal from a multichannel TxPIC is supplied to the FPWL sub-module 30 and to etalon and reference photocurrent outputs 32A and 33A and corresponding TIAs 34A and 34B, respectively, the resulting electrical signals will contain composite signals, i.e., average DC values and tone modulations imposed on the combined channel signals as well as data modulation on the channel signals, and noise, as well as from each of the N channels 15 on TxPIC 10. In the case of multi-channel input, an error signal for the $k^{TH}$ optical carrier frequency is determined using coherent demodulation to provide lock-in detection of square wave signal strengths at frequency, $f_k$, for etalon photodiode 33 and reference photodiode 32. Since etalon 34 is sensitive to temperature changes, a temperature sensor 39, shown here as thermistor 39, is provided on FPWL sub-module 30 which allows for more precise calibration of the FPWL lockpoints to frequencies on the standardized grid, such as an ITU grid, as a function of the temperature of FPWL sub-module 30.

An error signal representative of the deviation of the mean optical carrier frequency of the $k^{TH}$ laser 14 from its desired optical carrier frequency is extracted from the composite photocurrents from both TIA 34A and TIA 34B by coherently demodulating the tone signal strengths from the respective PDs 32 and 33 at tone frequency $f_k$ and comparing the result to a calibrated value determined for the desired optical carrier frequency. As previously indicated, demodulating tones are generated within FPGA1 35 and synchronized modulating tones are generated by FPGA2 at 42. For example, FPGA 35 may have a crystal clock to generate N tone frequencies for normalizing against the selected tone frequencies from sub-module 30. Also, FPGA 42 generates the same set of tone frequencies which are synchronized with the tone frequencies generated at FPGA 35 via a synchronization pulse sent from FPGA 35 to FPGA 42. The analog to digital conversion and coherent demodulation of the sample signal against the channel labeling tone are carried out by via FPGA 35 and associated signal processing error signals are then derived at DSP 44 which are filtered and scaled to provide for corrective changes of current provided to individual laser heaters 13 at TxPIC 10. In this manner, the mean optical carrier frequencies of N lasers are all driven to their assigned standardized grid frequencies or wavelengths, such as wavelengths assigned to the ITU grid, with steady-state error equal to zero. Monitoring of TxPIC parameters, including but not limited to, heater currents and laser bias currents, are employed to prevent the feedback servo loop from attempting to drive the TxPIC lasers 14 to improper lockpoints as more specifically pointed out later in this disclosure.

As previously indicated above, FIG. 3 illustrates a portion of the transmittance of etalon 34 where a reference level 36 is shown at cross points with vertical reference lines 37 for two channels k and k+1 defining lockpoints 38 for these channels. As indicated, the periodic spacing of etalon 34 here is 50 GHz. The TxPIC signal channel spacing is 200 GHz grid so that adjacent TxPIC channels will be locked to fringes separated by three intervening fringes or 150 GHz as seen in FIG. 3. Thus, for a given TxPIC laser 14 with an optical carrier frequency close to a lockpoint 38, i.e., between next closest points of intersection between reference line 36 and the side fringe of the periodic fringes, a laser frequency below or above a lockpoint 38 provides a difference of transmissions with a properly assigned error as negative or positive over a frequency range between lockpoint 38 and adjacent points along the channel side fringe. So, for example, if there is a positive frequency offset in a given demodulated signal, the demodulated tone level will be above reference level 36. By the same token, if there is a negative frequency offset in a given demodulated signal, the demodulated tone level will be below reference level 36. Thus, in the case of each demodulated tone, there is a window within which the demodulated signal value can be either above or below reference level 36 indicating in which direction, positive or negative, a correction must be made to move the emission wavelength of a particular laser 14 through temperature change via its local heater 13.

The output of FPGA1 35 in the form of demodulated tone signals is provided to DSP sub-module 40 and to DSP 44 via line 41. The output of FPGA2 42 is provided to digital signal processor (DSP) 44. Sub-module 40 includes associated digital-to-analog converters (DACs) 48 and analog-to-digital converters (ADCs) 46.

The signal processing that produces a demodulated tone signal is as follows. The output photocurrent from PD1 at 32 and PD2 at 33 is converted to a voltage at TIA 34A and 34B. The voltage level of the TIAs must be scaled appropriately relative to the input range allowed at a fast analog to digital converter. In FPGA1 at 35, the digital product of a bipolar square wave (allowed values +1, −1, with fundamental period equal to that of the particular channel labeling frequency) and the sampled waveform is formed, and an accumulation product equivalent to integration of the product of the bipolar square wave and the sampled waveform is calculated. The interval for integration contains an integer number of cycles of each of the channel-labeling square waves, and the channel-labeling square waves were chosen to be approximately orthogonal. Thus, the output of this FPGA integration at FPGA1 at 35 is a large number proportional to the strength of the signal modulated by the selected square wave. This, in turn, is proportional to the product of the optical modulation index (OMI) and the average optical power of the channel labeled by the selected square wave, at the receiving photodiode. For etalon channel 31B, the average optical power of the channel depends on the optical carrier frequency of the channel, because the etalon fringe serves as an optical frequency discriminator. For reference channel 31A, the average optical power of the channel is independent of optical carrier frequency. Thus, FPGA1 35 digitizes the tone frequencies for both voltage signals from the etalon input and the reference input. Parallel demodulation (via correlation with the approximately orthogonal square waves) for each of the N channels provides signals in the form of a measure of the respected tone strengths for each channel 15 of TxPIC 10. These signals are sent to DSP 44, via line 41, where an error signal for each channel is calculated. Further, DSP 44 then provides correction values, via DACs 48 and lines 60, in the form of correction signals to individual, respective laser channel heaters 13 of lasers 14 based upon calculated error signals determined in parallel for each signal channel. Each such correction signal changes the operating temperature of the laser via its associated heater which, in turn, will change the emission wavelength of the laser to correct that emission wavelength to be closer to or at its grid-designated and desired emission wavelength. In another embodiment, rather than change the current applied to a laser heater 13, the feedback loop 41 can be employed to change the bias current of a laser 14 in order to correct that emission wavelength to be closer to or at its grid-designated and desired emission wavelength. In the embodiment here, however, it is preferred that lasers 14 are operated at a constant current bias value over life and that each laser is provided with an associated on-chip heater 13 that changes the laser operating temperature which, in turn, changes its emission wavelength in a direction toward or to its standardized wavelength grid frequency.

As previously indicated, the wavelength locker operation at sub-module 30 can vary with ambient temperature so that an ideal set point for each emission wavelength for N lasers is initially calibrated during manufacturing for a whole range of operating temperatures and these calibrated setpoints are stored in a memory of DSP 44. Thus, at a given operating temperature of etalon sub-module 30, which is monitored by temperature sensor 39, the setpoint can be interpolated linearly between calibrated values for two adjacent temperature calibration points in the DSP memory. The error signal employed for wavelength locking feedback is based upon the difference between the calibrated setpoint and the interpolated setpoint. It can be seen that this approach provides an estimate of the wavelength for each tone modulated signal at given calibrated thermal setpoints for sub-module 30 so that the interpolation will provide a fairly accurate estimation of the wavelength offset, if any, of each laser 14 from its standardized grid wavelength.

As indicated above, the outputs of both the reference and etalon photodiodes 32, 33 are simultaneously demodulated for all N signal channels on TxPIC 10. A bi-linear combination of coherently demodulated photocurrents at a particular tone frequency from these photodiodes is employed to define a suitable error signal:

$$ErrorSignal = \frac{(I_{Etalon} - \kappa(T)I_{REF})}{(I_{Etalon} + \kappa(T)I_{REF})} \quad (1)$$

where $$\kappa(Y) = \frac{I_{Etalon}}{I_{REF}}$$

is evaluated at the standardized channel frequency to which the optical carrier frequency for the given signal channel should be locked to at a given temperature, T, as retrieved from temperature sensor 39 on FPWL sub-module 30. FIG. 3 illustrates an idealized case in which the etalon photocurrent is equal to the reference photocurrent, i.e., $\kappa(T)=1$, for all channel frequencies separated by 50 GHz. For a given optical channel and a given temperature for the Fabry-Perot wavelength locker, the ratio of the demodulated photocurrents corresponding to the desired optical carrier frequency (e.g. ITU grid frequency) is known from calibration. The difference between this calibrated value and the measured value provides a signed quantity indicative of the deviation of the channel optical carrier frequency with respect to the desired optical carrier frequency. Once the error signal is measured, the corrective actions to be taken by the channel's heater can be calculated and applied. One form of an error signal for signal channel, k, is formed in DSP 44 from the combination, $$\text{Error} = \frac{(I_{ET} - I_{REF})}{(I_{ET} + I_{REF})} \text{ Measured} - \frac{(I_{ET} - I_{REF})}{(I_{ET} + I_{REF})} \text{ Calibrated} \quad (2)$$

where $I_{ET}$ is the demodulated etalon photocurrent signal for channel k and $I_{REF}$ is the demodulated reference photocurrent signal for channel k. "Measured" in formula (2) refers to the result of the demodulation process and, "calibrated" refers to a previously measured or calculated value determine by the calibration process used to define the response of the etalon and reference paths to an optical carrier frequency equal to the desired value. The temperature of the Fabry-Perot wavelength locker might be temperature-controlled, in which case a single calibration value can be used. Alternatively, a Fabry-Perot wavelength locker without temperature control can be calibrated at a variety of temperatures, and interpolation can be used to establish the appropriate calibration value at a given measured temperature for the wavelength locker. The error signal is the input to a feedback loop that drives the error signal to zero. The loop-filtering of the error signal is digitally implemented by DSP 44 and provided to the digital to analog converter (DAC) to produce a correction signal that is a scaled analog output signal that controls the current to the respective heater 13 for the laser in channel, k, to drive the error signal to zero under integral control.

Of course, FPWL manufacturing tolerances cause deviations from the ideal feedback loop condition so that is why it is important that measurements be calibrated relative to the temperature of FPWL sub-module 30 as monitored by temperature sensor 39. The feedback loop 41 of FIG. 1 is designed to drive the optical carrier frequency of a laser in the direction opposite to the algebraic sign of the error signal. In FIG. 3, the error signal has three possible adjacent zero-crossings in the vicinity of each local fringe. For the control loop to lock the optical carrier frequency to the correct local setpoint when the feedback loop 41 is engaged, the laser optical carrier frequency must lie within a given range around the desired setpoint. In order to make sure that the loop locks the optical carrier frequency to the correct fringe among the periodic fringes of the Fabry-Perot etalon, a lookup table based on calibration of laser currents, heater currents, submount temperatures, and interactions among multiple channels of a TxPIC may be provided. Given the appropriate calibration information and measured values for all of these frequency-affecting inputs, DSP 44 can determine whether the range of applied values correspond to a valid optical frequency setting affiliated with a particular fringe of the Fabry-Perot wavelength locker. This is discussed further below in connection with rapid response to channel failure conditions.

DSP 44 includes an integrator that integrates the error signal for each given laser wavelength over time (after scaling by affixed gain constant) to achieve an average value which is provided to a particular DAC 48 which, in turn, generates an analog correction signal that drives a particular heater 13 for a particular laser 14. If the integrator output is a positive correction signal, this corresponds to a red shift (lower frequency or wavelength) and an increase in heater power. On the other hand, if the integrator output is negative correction signal, this corresponds to a blue shift (higher frequency or wavelength) and a decrease in heater power. The integrator saturates such that, for a fixed frequency offset, a correction signal to the given laser will always end up with the correct polarity. If for any reason, the correction signal exceeds a predetermined laser adjustment range, such as, for example, +/−1 to 5 GHz, then the wavelength locker loop controller will shut down the operation of the particular PIC laser affected. This is an indication that the laser is not properly operating and needs to be taken out of service.

In connection with the foregoing, FIG. 5 shows graphically illustrates a red shift relative PD2 33 current, $i_{PD}$ versus optical frequency relative to an etalon fringe as $i_{PD-Etalon}$. The point A at $i_{PD-Ref}$ is the desired lockpoint where the grid wavelength or frequency is proper for a standardized (ITU) grid frequency for a given modulated source output wavelength. The red shift at $i_{PD-Shift}$ to point B is the amount of decrease from $i_{PD-Ref}$ indicative (proportional) to the amount of decrease in emission wavelength of a laser 14 from the standardized (ITU) grid frequency. This shifted amount of error can be expressed as the following ratio:

$$\text{Error} = \frac{i_{PD-Etalon}}{i_{PD-Ref}} \quad (3)$$

A correction signal is developed to blue shift the wavelength operation at laser 14 via heater 13, i.e., increase applied heat to the laser, so that the wavelength operation of the laser is brought back from point B to be as close as possible to point A.

It should be noted that when the operation of the wavelength locker system of FIG. 1 is first turned on or in the case of a fringe correction event (triggered by detection of an invalid setting at DSP 44), the laser heater outputs are preset to an expected value and to a negative frequency offset (red shift) so as to allow for thermal stabilization prior to operation of the feedback wavelength control loop 41. Laser heater power as well as the derived heater resistance is continuously monitored by the wavelength locker loop DSP 44, via the ADCs 48, and the heater drive circuits (not shown). If the derived resistance is outside a predetermined threshold range, then, wavelength locker loop controller DSP 44, will drop this channel laser from operation. Of course, during startup, the heater power is allowed to initially stabilize before any such action is taken by the wavelength locker loop DSP 44.

C. Prevention of Locking to Incorrect Lockpoints

The feedback wavelength control loop 41 illustrated in FIG. 1 without other information would not be able to determine if it had locked a given laser carrier frequency to an incorrect lockpoint, that is, it may, instead, have locked the frequency to an adjacent incorrect fringe rather than the correct fringe. In other words, since the wavelength locker characteristic is periodic, the derived error signal, previously discussed, provides no indication in and of itself of the particular fringe in FIG. 3 to which a particular optical carrier frequency is locked, yet the tuning range for each laser in the PIC encompasses multiple fringes. Also, thermal coupling on TxPIC chip 10 between integrated elements on the chip as well as to a thermoelectric cooler (TEC) (not shown), underlying the TxPIC chip 10, may be sufficiently strong that (1) a thermal transient may cause a particular laser's frequency to jump to align to an incorrect fringe before the wavelength feedback loop 41 could correct for such a thermal transient; (2) thermal transients generated by the disabling of, or the failure of, another adjacent laser or laser heater on the chip are of adequate magnitude to cause a jump to an adjacent fringe; (3) at initialization and powering up of TxPIC 10, the last known good laser heater values will not reliably initialize the laser frequency or wavelength to within a desired capture range if a change has been made to the enabled or disabled state of any of the PIC lasers 14 or their heaters 13; or (4) thermal changes due to normal laser aging vary thermal crosstalk into each adjacent laser and this crosstalk effect is accounted for by periodically storing of the last know good heater values which may different due to different laser aging. Thus, additional information must be employed to prevent the wavelength control loop 41 from inadvertently driving a laser wavelength toward another incorrect fringe, resulting in controlling the optical carrier frequency to an incorrect setpoint.

This additional information is provided in a lookup table in the memory of DSP 44 that includes all of the last known good values for all operating parameters of the TxPIC 10 that particularly affect the laser carrier frequency. The predominant set of these operating parameters for a given TxPIC are: (1) the laser bias currents, which, it will be recalled, are held fixed throughout TxPIC life; (2) heater currents, which, it will be recalled, are varied by feedback control throughout TxPIC life; (3) the (fixed) temperature of the TxPIC submount (not shown), which is generally mounted on a thermoelectric cooler (TEC) (not shown); (4) the electro-optic modulator (EOM) bias voltages; and (5) the front PIN reverse bias voltages. Also, as previously discussed above, there is a need for a lookup table of calibrated lockpoint ratios k(T) for all N signal channels on TxPIC 10. Lastly, there is a need for lookup tables of heater-induced tuning coefficients for all TxPIC N channels including their channel crosstalk coefficients. Using this information, as stored in DSP memory, DSP 44 can determine from this information in the lookup tables whether the feedback wavelength loop is currently being asked to provide heater driver powers that are inconsistent with last known good lockpoints. Note, as previously indicated, that adjacent available lockpoints are separated by the free spectral range (FSR) of the etalon, which here is 50 GHz. To move an individual laser optical carrier frequency from a correct lockpoint in FIG. 3 to an incorrect adjacent lockpoint requires a laser heater to attempt to raise or lower its associated laser temperature by as much as about 5° C., which is a large, easily-detected change in heater power. Thus, the current supplied to laser heaters 13 are monitored by DSP 44 for comparison to the last known good values or average values of applied current to the respective laser heater 13 on TxPIC 10. In this case, DSP 44 will prevent such an application of improper laser heater power to be applied, particularly outside its range of power normalcy based on this last known good tracking methodology.

2. Per Channel Transmit Power Control Loop

Also, in this disclosure, is a method for determining the relative balance of the channel powers which leverages the same channel-labeling modulation described above for the wavelength locking control using feedback control loop 41. A per-channel power control loop operates to equalize channel power across the array of signal channels forming the optical channel group (OCG). More generally, a per-channel power control loop operates to hold individual optical channel powers at individual setpoints that may differ from one channel to the another. When used to equalize channel powers, the function of the per-channel loop is to equalize channel power across the channel array to within a predetermined error, such as, for example, ±0.50 dB, for any channel power relative to the average powers within the OCG over the life of TxPIC 10. This power loop is initiated at turn-up during initialization of TxPIC 10. With reference again to FIG. 1, each channel power output is controlled by its front PIN 18. Having the front PIN serve the dual purpose of individual channel power control and channel-labeling modulator reduces the number of active channel elements and control electronics required Thus, element 18 may also be referred to as a multifunction element (MFE) and can be referred to as an attenuator/modulator tone PIN front PIN 18 absorbs a portion of the modulated channel signal received from the channel modulated source 14, 16 based on an average bias voltage determined by the combination of a variable bias voltage, $V_{High}$, and a peak-to-peak voltage, $V_{PP}$, supplied from DSP 44 in sub-module 40 via generator The amount of attenuation required for each channel is determined by two factors. First, the multiple laser optical outputs at beginning of life (BOL) are not perfectly balanced and may vary from one another by a given amount. At manufacture, the optimum constant drive current for each laser is determined such that: (1) each laser 14 can be wavelength locked within the acceptable limits of laser heater power; (2) the laser power can be adjusted to within the required tolerance of its front PIN 18; and (3) the desired bit error ratio in transmission links can be met when high frequency data modulation is applied to the channel modulator 16. As previously indicated, per channel laser drive current is held constant over the life of TxPIC 10. The proper laser bias current values are initially determined during PIC module manufacturing and the predetermined values for each laser are transferred and stored in memory, such as a flash memory, in DSP 44 in sub-module 40. However, calibration of the laser drive currents on TxPIC 10 itself does not, in and of itself, insure power balance across the array of signal channel outputs on the PIC so that a value of attenuation that will be required via a front PIN 18 for each TxPIC channel to be set to achieve power equality across the channel outputs, and these front PIN attenuation values will vary from channel to channel over PIC life.

Second, the integrated lasers 13 in TxPIC 10 age at different rates over the life of the circuit and, normally, throughout this aging process, their output powers decrease, again, at different rates. Therefore, front PIN attenuation for each signal channel must typically be gradually reduced as the laser power decays; i.e., the average reverse bias voltage on front Pin 18 typically has to be decreased over life. Therefore, the applied negative bias is highest at the beginning of life (BOL) of PIC lasers 14 and is generally decreased over life to maintain a substantially constant power output from the modulated sources over PIC life. Thus, lasers 14 at BOL are operated at a continuous applied current level for life with a high magnitude of output power. The attenuation is set for each laser at the desired initial power level output from each channel and the power outputs across the channel array are substantially equalized. Since lasers 14 each age at a different rate, which are not individually predictable, their adjusted output powers will decrease at different rates over life, and, therefore, it is necessary that the attenuation be withdrawn, i.e., negative bias is reduced at front PINs 18, from each channel output over life at a different rate too. Similarly, increases of individual channel powers can be compensated by increases in attenuation settings of front PINs where necessary.

Therefore, power control feedback loop 41 is employed to determine the amount of attenuation per channel to apply in order to continually maintain a balance of channel power outputs across the array of modulated channel signals produced on TxPIC 10. The average bias point for each front PIN 18 is, therefore, calculated at DSP sub-module 40 via DSP 44 and is applied to each front PIN 18 in a closed loop control 41 along with the application of a tagging tone frequency to each front PIN 18 for signal channel identification. The average bias voltage is the mean of the voltages $V_{High}$ and $V_{Low}$, where values of $V_{High}$ and $V_{Low}$ are chosen to maintain a constant optical modulation index. The power control loop 41 operates on a relatively long time constant, such as around 5 seconds, and is designed to adjust the attenuation level based upon the manufacturing variables, mentioned above, and laser device aging, which, of course, is a comparatively slower process than wavelength changes from a desired wavelength. This time period could also be set for longer periods of times, if desired, since laser aging is, comparatively, a much slower process.

As previously indicated, a low frequency or tone amplitude modulation is superimposed on the front PINs 18 in each of the N signal channels of TxPIC 10. The values of the voltages applied are contingent upon the estimated attenuation curve for front PINs 18 and are scaled so as to provide a particular optical modulation index (OMI), as previously discussed. Also, as indicated earlier, the optical channel group (OCG) multiplexed signal from TxPIC multiplexer 20 is tapped and provided to the Fabry-Perot wavelength locker sub-module 30 where the etalon output on line 33A and reference output on line 32A are amplified and digitized and are together employed for determining wavelength offset and adjustment. However, as noted, etalon output 31B is not used for purposes of power control. Only the reference output 31A is necessary for this purpose. The digitized OCG envelope from the reference output 31A is coherently demodulated at FPGA1 35 for each tone. This process is simultaneous, i.e., done in parallel for all N signal channels such that data is continuously provided for all channel tones. At sub-module 40 in DSP 44, the N channel demodulator outputs from FPGA1 35 via line 41 can then be respectively compared with the originally generated modulated tones to obtain the relative amplitude of each of the N tones for each signal channel 15. Given that the OMI is held at constant value, such as at 5% for each tone, the relative carrier amplitude detected for each channel is the same as the relative tone amplitude. Thus, this channel power detection scheme assumes, the same OMI for each channel tone modulation. As described previously, calibration of individual front PIN transfer functions is required in order to determine the correct values of the voltage rails of an applied square wave to provide the required attenuation while holding the optical modulation index constant. Also, the front PIN transfer function changes as the incident laser power changes. Therefore, the initial front PIN transfer function must be calibrated at the time of manufacture and the changed over life must be estimated since the laser incident power on front PIN 18 cannot readily be directly measured.

Thus, the attenuation versus bias curve for each front PIN 18 at beginning of life (BOL) is calibrated during initial manufacturing with the laser operating at a fixed drive current, which current level is predetermined during calibration by varying the bias over a given voltage range and measuring the output power from TxPIC 10. A plurality of voltage steps are, therefore, taken through the voltage range at equal steps in bias voltage. This first set of output powers as a function of applied reverse bias voltage on the front PIN is measured externally for each channel. The set of points (normalized attenuation versus reverse bias) is stored in the memory of DSP 44, together with the corresponding Back PIN current that provides a measure of the output power of the laser. Then, a second set of a plurality of points (normalized attenuation versus reverse bias, with an associated Back PIN current) is taken and stored, but this time with the applied laser drive current intentionally decreased for each laser to simulate an end of life (EOL) power level across the array, and with all wavelengths held constant at their BOL values. This simulation is based upon aging experience of the laser array on TxPIC 10 where, the decay of laser power output may be in the range of about 1.5 dB to about 3 dB over life.

More particularly, then, at manufacture, two normalized front PIN transfer functions are created; one for the beginning of life (BOL) state and one for the simulated end of life (EOL) state. An algorithm is employed that interpolates between the two transfer functions, based on the reading of the Back PIN current. The interpolated, normalized transfer functions are used to calculate appropriate values of $V_{High}$ and $V_{Low}$, as depicted in FIG. 4, for each signal channel to provide the desired attenuation while holding the optical modulation index constant.

Therefore, during operation, the real-time photocurrent received from back PDs 12 is employed to estimate the laser power. Then, the beginning of life (BOL) and the simulated end of life (EOL) front PIN curves, relative to the two different mentioned sets of data above, are linearly interpolated to form a new front PIN attenuation curve associated with the estimated laser power. Based upon the newly derived normalized transfer function, two voltages $V_{High}$ and $V_{Low}$ are chosen such that, (1) the desired demodulated tone signal is obtained at reference output 31A in the FPWL sub-module 30 and (2) the estimated OMI is maintained at a predetermined value, such as an OMI at 5%. For a given channel, the demodulated tone signal is proportional to the product of the optical modulation index and the average optical power of the channel labeled by the channel-labeling tone used for demodulation. If all demodulated tone signals are made to be equal as seen the reference photodiode in the Fabry-Perot wavelength locker, and if all channels have the same optical modulation index for their (orthogonal) channel labeling tones, then all channel powers are approximately equal at the reference photodiode. This is the basis of optical channel power control. Note that the reference photodiode in the Fabry-Perot wavelength locker serves dual roles as the detector for optical channel power control and as one of two detectors needed for the wavelength locking control.

While the invention has been described in conjunction with several specific embodiments, it is evident to those skilled in the art that many further alternatives, modifications, and variations will be apparent in light of the foregoing description. Thus, the invention described herein is intended to embrace all such alternatives, modifications, applications and variations as may fall within the spirit and scope of the appended claims.

What is claimed is:

1. A photonic integrated circuit comprising:
a substrate; and
a plurality of signal channels provided on the substrate, each of the plurality of signal channels comprises:
a modulated source providing a corresponding one of a plurality of first modulated optical outputs at a respective one of a plurality of emission wavelengths; and
an active element which superimposes a respective one of a plurality of tone frequencies on a corresponding one of the plurality of modulated optical outputs to provide a corresponding one of a plurality of second modulated optical outputs,
wherein the plurality of tone frequencies are employed to determine a respective one of the plurality of emission wavelengths and a corresponding one of a plurality of power values of a corresponding one of the plurality of signal channels.

2. The photonic integrated circuit of claim 1 wherein each corresponding one of the plurality of signal channels further comprising a heater element to adjust a temperature of the modulated source to adjust the respective one of the plurality of emission wavelengths of the modulated source.

3. The photonic integrated circuit of claim 1 wherein the active element of each of the plurality of signal channels comprises a p-i-n (PIN) junction device, a laser, an optical modulator, a semiconductor optical amplifier, a variable optical attenuator, or a photodetector.

4. The photonic integrated circuit of claim 1 wherein the modulated source of each of the plurality of signal channels comprises a directly modulated laser, or a continuous wave laser with an external electro-optic modulator.

5. The photonic integrated circuit of claim 1 further comprising a multiplexer provided on the substrate and having a plurality of inputs and an output, each of the plurality of inputs of the multiplexer configured to receive a respective one of the plurality of second modulated optical outputs, the multiplexer combining the plurality of second modulated optical outputs into a WDM signal provided at the output of the multiplexer.

6. A photonic integrated circuit comprising:
a plurality of signal channels provided on a substrate, each of the plurality of signal channels comprising:
a modulated source providing a corresponding one of a plurality of first modulated optical signals, each of the plurality of first modulated optical signals having a corresponding one of a plurality of predetermined emission wavelengths at a corresponding one of a plurality of predetermined optical powers; and
an active element configured to receive a corresponding one of the plurality of first modulated optical signals and a respective one of a plurality of tone frequencies, the active element superimposing the respective one of the plurality of tone frequencies on the corresponding one of the plurality of first modulated optical signals to form a corresponding one of a plurality of second modulated optical signals,
wherein the plurality of tone frequencies are employed to determine a corresponding one of a plurality of emission wavelength offset values relative the predetermined one of the plurality of emission wavelengths and a corresponding one of a plurality of optical power offset values relative the predetermined one of the plurality of optical powers for a corresponding one of the plurality of first modulated optical signals.

7. The photonic integrated circuit of claim 6 wherein each of the plurality of signal channels further comprises a control circuit to provide a correction signal to the modulated source, the correction signal employed to adjust a corresponding one of the plurality of emission wavelengths of a corresponding one of the plurality of first modulated output signals from the modulated source.

8. The photonic integrated circuit of claim 7 wherein the correction signal comprises a corresponding one of a plurality of bias currents applied to the modulated source of a corresponding one of the plurality of signal channels.

9. The photonic integrated circuit of claim 8 wherein each of the plurality of signal channels further comprises a heater configured to accept the correction signal and adjust a temperature of the modulated source and adjust a corresponding one of the plurality of the emission wavelengths of the modulated source.

10. The photonic integrated circuit of claim 9 wherein the correction signal applied to the modulated source of each of the plurality of signal channels reduces a corresponding one of a plurality of emission wavelength offset values relative the predetermined one of the plurality of emission wavelengths or reduces a corresponding one of a plurality of optical power offset values relative the predetermined one of the plurality of optical powers for a corresponding one of the plurality of first modulated optical signals.

11. The photonic integrated circuit of claim 6 wherein each of the plurality of modulated tone frequencies comprises a square wave or a sine wave with an applied bias to adjust an output power of a corresponding one of the plurality of second modulated output signals.

12. The photonic integrated circuit of claim 6 further comprising an optical combiner provided on the substrate having a plurality of inputs and an output, each of the plurality of inputs of the combiner configured to receive a respective one of the plurality of second modulated output signals, the combiner combining the plurality of second modulated output signals into a WDM signal provided on the output of the combiner.

13. The photonic integrated circuit of claim 12 wherein the optical combiner is a wavelength selective combiner or a free space coupler combiner.

14. The photonic integrated circuit of claim 12 wherein the optical combiner is an arrayed waveguide grating, an Echelle grating or a MMI coupler.

15. The photonic integrated circuit of claim 6 wherein the active element in each of the plurality of signal channels comprises a p-i-n (PIN) junction device, a laser, an optical modulator, a semiconductor optical amplifier, a variable optical attenuator, or a photodetector.

16. The photonic integrated circuit of claim 6 wherein the modulated source of each of the plurality of signal channels is a directly modulated laser, or continuous wave laser respectively coupled to an external electro-optical modulator.

* * * * *